(12) United States Patent
Youngwerth et al.

(10) Patent No.: US 12,491,609 B2
(45) Date of Patent: Dec. 9, 2025

(54) VISE

(71) Applicant: VersaBuilt, Inc., Boise, ID (US)

(72) Inventors: Alexander D. Youngwerth, Boise, ID (US); Albert James Youngwerth, Boise, ID (US); Benjamin Thomas Blaine, Eagle, ID (US); Eric Lebsack, Kuna, ID (US); Dan Thompson, Boise, ID (US)

(73) Assignee: VersaBuilt, Inc., Boise, ID (US)

( * ) Notice: Subject to any disclaimer, the term of this patent is extended or adjusted under 35 U.S.C. 154(b) by 313 days.

(21) Appl. No.: 18/043,547

(22) PCT Filed: Aug. 31, 2021

(86) PCT No.: PCT/US2021/048549
§ 371 (c)(1),
(2) Date: Feb. 28, 2023

(87) PCT Pub. No.: WO2022/051307
PCT Pub. Date: Mar. 10, 2022

(65) Prior Publication Data
US 2023/0264322 A1 Aug. 24, 2023

Related U.S. Application Data

(60) Provisional application No. 63/073,915, filed on Sep. 2, 2020.

(51) Int. Cl.
*B25B 1/18* (2006.01)
*B25B 1/10* (2006.01)
*B25B 1/24* (2006.01)
*B25B 5/08* (2006.01)

(52) U.S. Cl.
CPC ............... *B25B 1/18* (2013.01); *B25B 1/106* (2013.01); *B25B 1/241* (2013.01); *B25B 5/087* (2013.01); *B25B 1/2405* (2013.01)

(58) Field of Classification Search
CPC .......... B25B 1/18; B25B 1/106; B25B 1/241; B25B 5/087; B23Q 3/066
USPC ..................................................... 269/20, 25
See application file for complete search history.

(56) References Cited

U.S. PATENT DOCUMENTS

| | | | | |
|---|---|---|---|---|
| 2,345,401 | A * | 3/1944 | Lindegren | B25B 1/18 269/30 |
| 2,683,386 | A * | 7/1954 | Doebeli | B25B 1/18 269/157 |
| 4,890,541 | A | 1/1990 | Spooner | |
| 6,655,673 | B2 | 12/2003 | Colby | |
| 6,957,809 | B1 | 10/2005 | Ferrara et al. | |

(Continued)

FOREIGN PATENT DOCUMENTS

| | | |
|---|---|---|
| DE | 3137100 A1 | 5/1982 |
| GB | 472741 A | 9/1937 |

*Primary Examiner* — Mahdi H Nejad
(74) *Attorney, Agent, or Firm* — Foster Garvey PC (57) ABSTRACT

Disclosed are vise embodiments designed to lower manufacturing cost and work well in an automated CNC milling production environment. The disclosed embodiments include rigid vises having high clamp force and low internal friction. The embodiments include features for resisting the ingress of metal chips into sensitive moving parts through the use of commonly available seals and the flow of CNC coolant to flush metal chips away from the vise.

9 Claims, 11 Drawing Sheets

(56) References Cited

U.S. PATENT DOCUMENTS 7,784,775 B1\* 8/2010 Somerville ........... B25B 1/2405
269/25

\* cited by examiner

VISE

RELATED APPLICATION

This application claims priority benefit of U.S. Provisional Patent Application No. 63/073,915, filed Sep. 2, 2020, which is hereby incorporated by reference in its entirety.

TECHNICAL FIELD

This disclosure generally relates to vises and, more particularly, to precision automatic vises actuated via pneumatic or hydraulic pressure and suitable for part holding in CNC milling or other machining applications, especially applications in which the vise is loaded automatically by a robot.

BACKGROUND INFORMATION

An example attempt at a precision automatic vise is a KSP-160 vise available from SCHUNK GmbH & Co. KG of Lauffen am Neckar, Germany. The KSP-160 vise includes a body, a pneumatic piston coupled to a wedge, and a left and right jaw, each having a hook feature that is configured to be captured by the wedge such that when the piston moves, the jaws move away or towards each other. The angle of the wedge and hook relative to the piston and jaws allow the piston to have a mechanical lever such that the distance traveled by the piston creates a smaller distance traveled in each jaw, thereby multiplying the force of the piston.

The wedge hook vise design provides clamp force and rigidity suitable for some applications, but the present inventor recognized that the aforementioned design has at least three disadvantages explained later in detail. Accordingly, the present inventor appreciated that a need exists for an improved precision automatic vise.

SUMMARY OF THE DISCLOSURE

Disclosed are vise embodiments designed to lower manufacturing cost and work well in an automated CNC milling production environment. The disclosed embodiments include rigid vises having high clamp force and low internal friction. The embodiments include features for resisting the ingress of metal chips into sensitive moving parts through the use of commonly available seals and the flow of CNC coolant to flush metal chips away from the vise.

In some embodiments, a vise is configured to apply a clamp force in response to a pressure change. The vise includes a housing. The housing includes a pocket providing a pressure zone, a shaft bore, and a coupling aperture located between the shaft bore and the pocket. The vise also includes a piston defining a nominal piston face area in the pressure zone. The piston is configured to slide in the pocket in response to the pressure change that actuates the clamp force as a function of a realizable piston face area representing a reduction from the nominal piston face area. The vise has a guide shaft configured to slide in the shaft bore in response to the pressure change. The vise also has a piston rod coupling shaft having a rod-connection cross-section area that is less than that of the guide shaft, the piston rod coupling shaft configured to mechanically couple the piston and the guide shaft so that the nominal piston face area is reduced by an amount corresponding to the rod-connection cross-section area, thereby forming the realizable piston face area that is greater than that which would be available with a direct interface between the guide shaft and the piston.

To maximize the repeatability of the workpiece clamping position, the vise uses a fixed jaw and a moveable jaw. The moveable jaw is guided by high precision steel shafts sliding in precision machined bores. Mechanical coupling between the precision steel shafts and the precision machined bores allows for self-alignment during the assembly process allowing for reduced clearances between the precision steel shafts and precision machined bores increasing the accuracy of the vise and reducing friction in the moveable jaw. Pneumatic or hydraulic pressure acts on a larger square piston directly coupled to the precision steel shafts eliminating the friction caused by the mechanical coupling of the wedge hook vise design. The use of a steel shaft in a bore allows for the use of inexpensive shaft wipers commonly used in hydraulic cylinders and other applications. In particular, a shaft wiper is very effective at preventing small metal chips from entering the precision machined bore.

Additional aspects and advantages will be apparent from the following detailed description of embodiments, which proceeds with reference to the accompanying drawings.

DETAILED DESCRIPTION OF EMBODIMENTS

As noted previously, the present inventor recognized three disadvantages with the previous wedge hook vise design. These three disadvantages are described in the following three paragraphs.

A first disadvantage is cost of manufacturing. To achieve rigidity in a compact space with many moving parts, wedge hook vises are generally machined from large pieces of steel with large amounts of metal removed from the final pieces. Because of the high forces the steel pieces encounter, the vise must be constructed from steel that can be heat treated to increase hardness while remaining dimensionally stable. Such steels are more expensive than other materials that can be used in a vise. In addition, the dimensional precision of each piece must be very high to maintain high precision in the vise and to minimize friction so that the vise clamp force remains high. All of these characteristics conspire to make the cost of the traditional wedge hook vise high.

A second disadvantage of the wedge hook vise design is cutting chip intrusion. The CNC machining process can make small, thin metal chips that find a way down to the vise jaw interface. Between each moveable jaw is a rectangular space covered by a closely fitting rectangular cover plate. As the vise opens and closes, small metal chips can pass under the cover plate, moving inside of the vise where the metal chips can cause damage or cause the vise jaw movement to be restricted. Chip intrusion can become a bigger problem when a robot is loading the vise. A human operator can recognize when metal chips may be collecting in a position that will cause damage and mitigate the problem using a cognitive solution. Most robot systems will not be able to recognize and mitigate a chip intrusion problem.

A third disadvantage of the wedge hook design is the friction between the moving parts. Friction harms the function of the vise by reducing the clamp force of the vise and by increasing the cracking pressure of the vise. Cracking pressure is defined as the minimum pneumatic or hydraulic pressure that must be applied to the vise so that the vise jaws move and clamp onto a workpiece. When the cracking pressure is high, controlling the minimum amount of force the vise generates is reduced. Clamping delicate parts at low pressures is not possible. Additionally, friction in the vise can reduce the amount of clamp force available at the vise jaws, reducing the vise's ability to convert all of the activating pressure into useful clamping pressure at the vise jaws.

FIGS. 1-6 show an automatic vise 10 including a fixed housing 12, a moveable jaw assembly 14, a square piston 16, piston rod coupling shafts 18, and a support shaft housing 20. Fixed housing 12 includes shaft bores 22 to receive guide shafts 24 of moveable jaw assembly 14. Shaft bores 22 include a counterbore 26 configured to receive shaft wiper seals 28. Fixed housing 12 includes a square piston pocket 30 opposite shaft bores 22 and configured to receive square piston 16. At the perimeter of square piston pocket 30 is an o-ring groove 32 and threaded holes 34 configured to receive a cover plate 36 such that when cover plate 36 is attached to fixed housing 12 using screws 38 and an o-ring 40, an airtight seal is created between cover plate 36 and square piston pocket 30.

Figure 1:
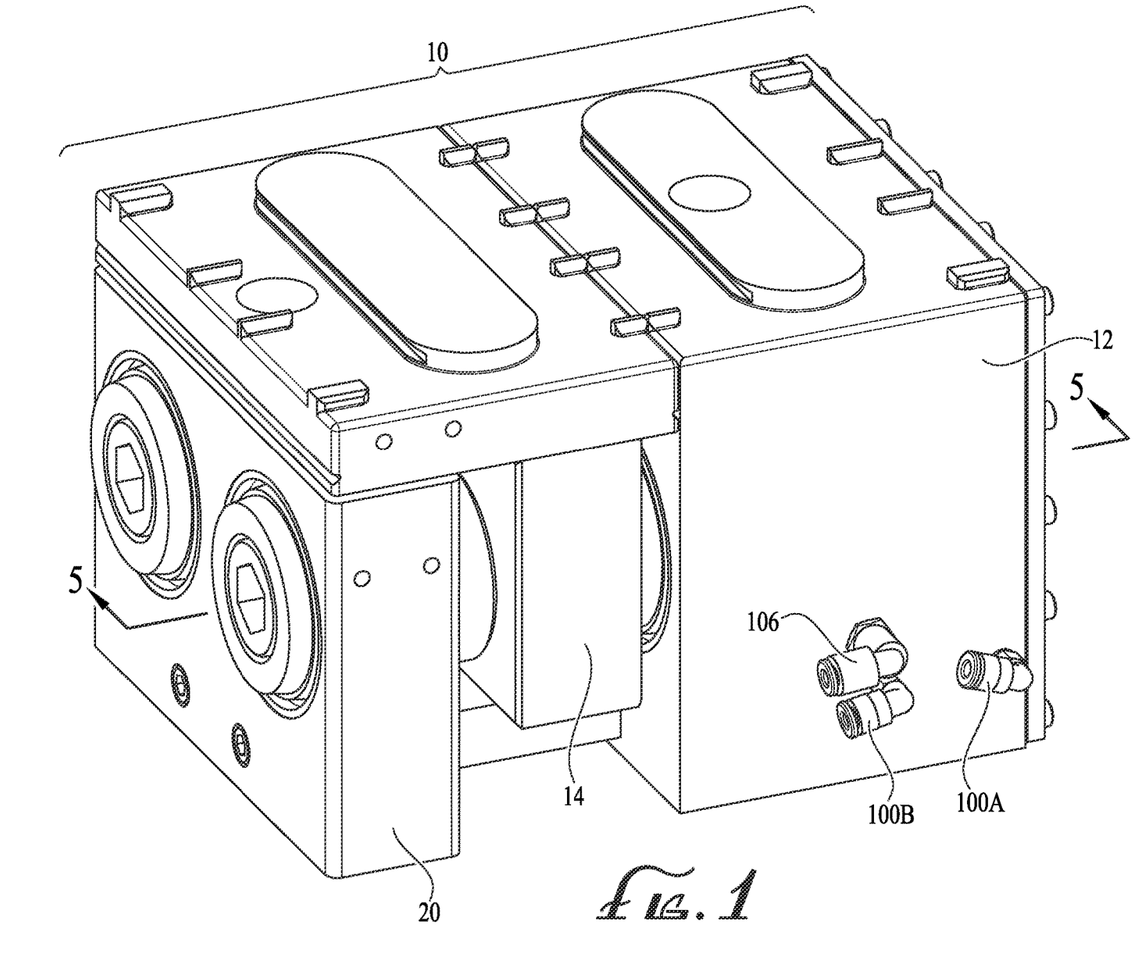
FIG. 1 is an isometric view of a vise, according to one embodiment.
Figure 2:
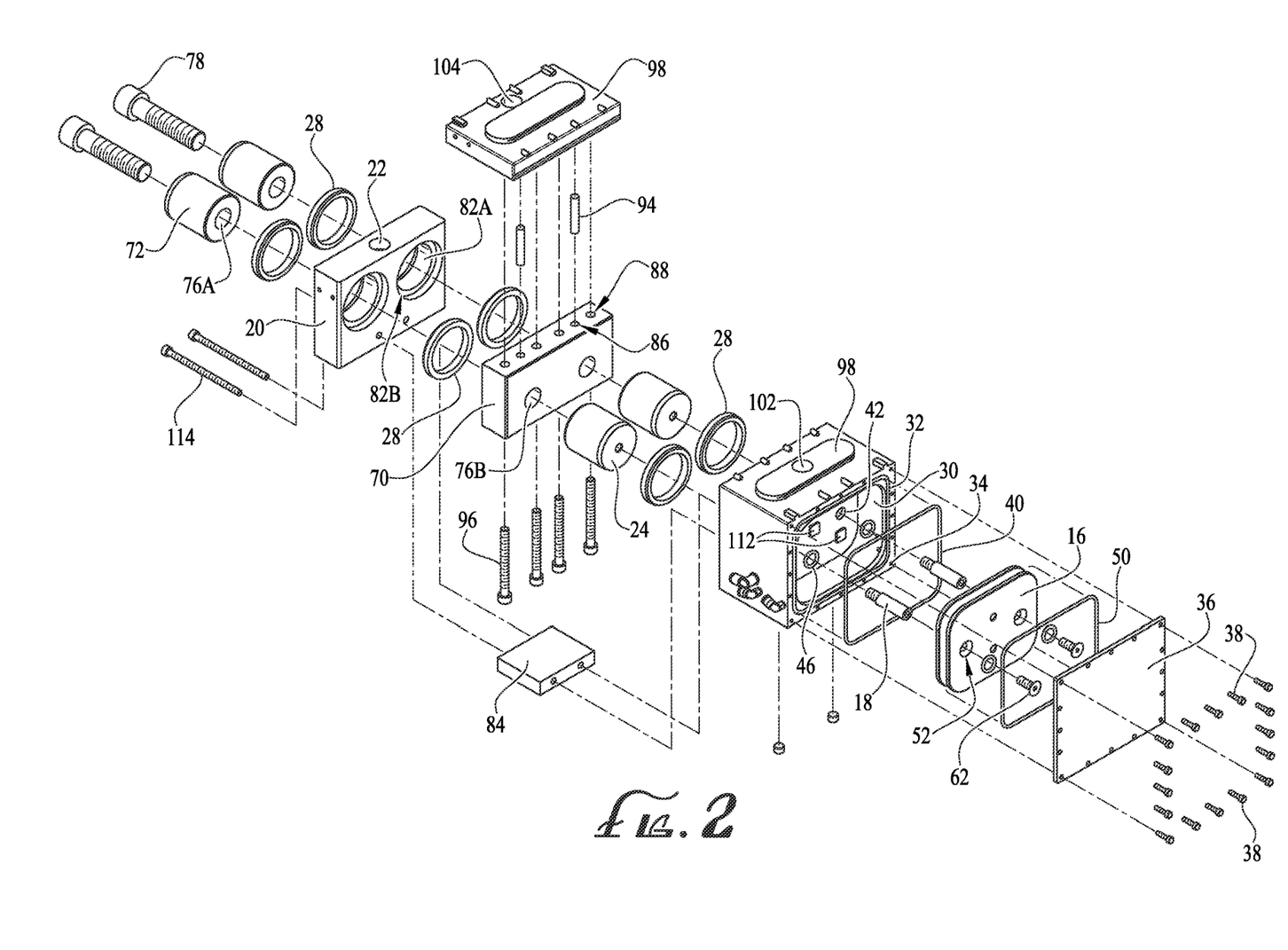
FIGS. 2 and 3 are exploded isometric views of the vise.
Figure 3:
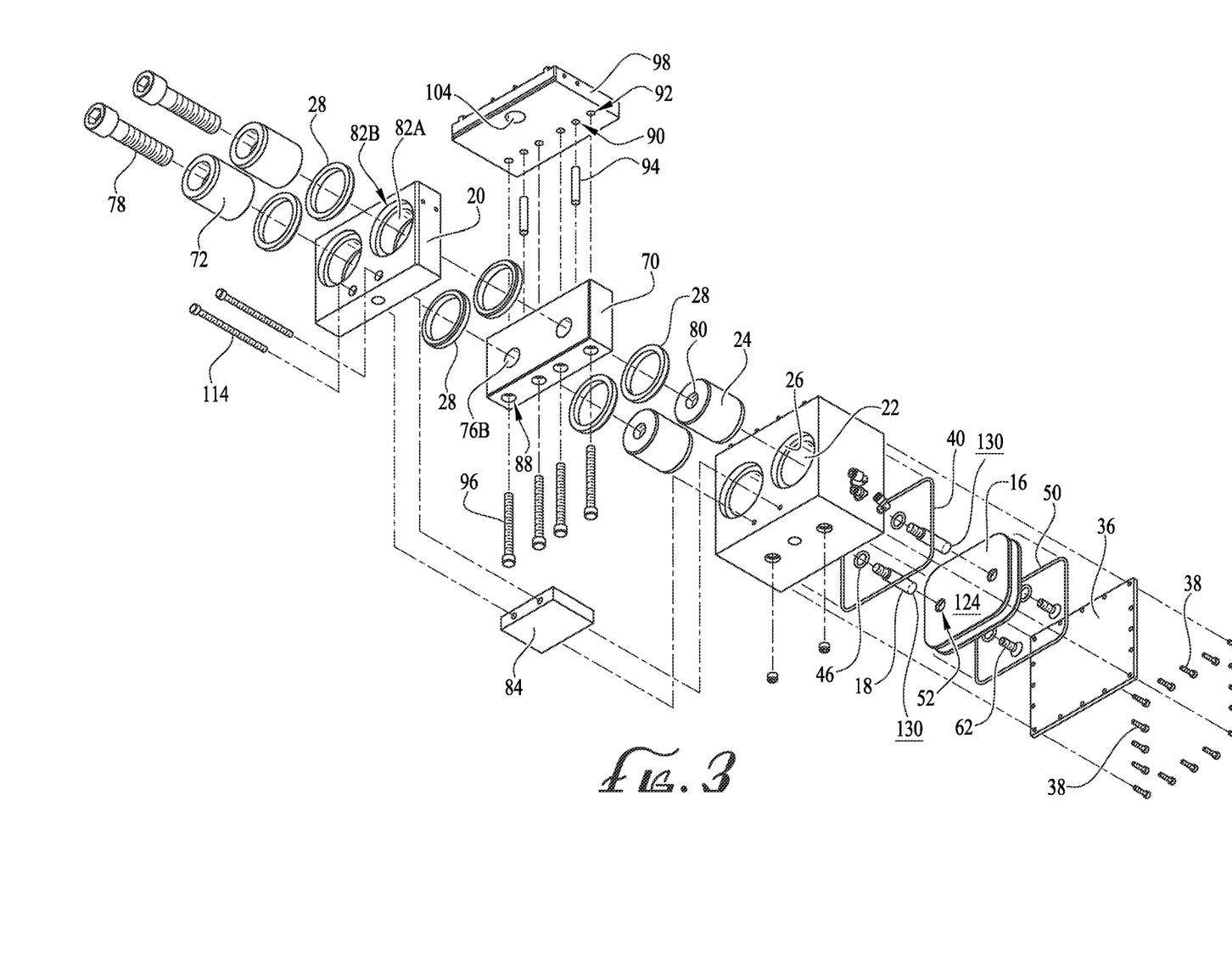
Figure 4:
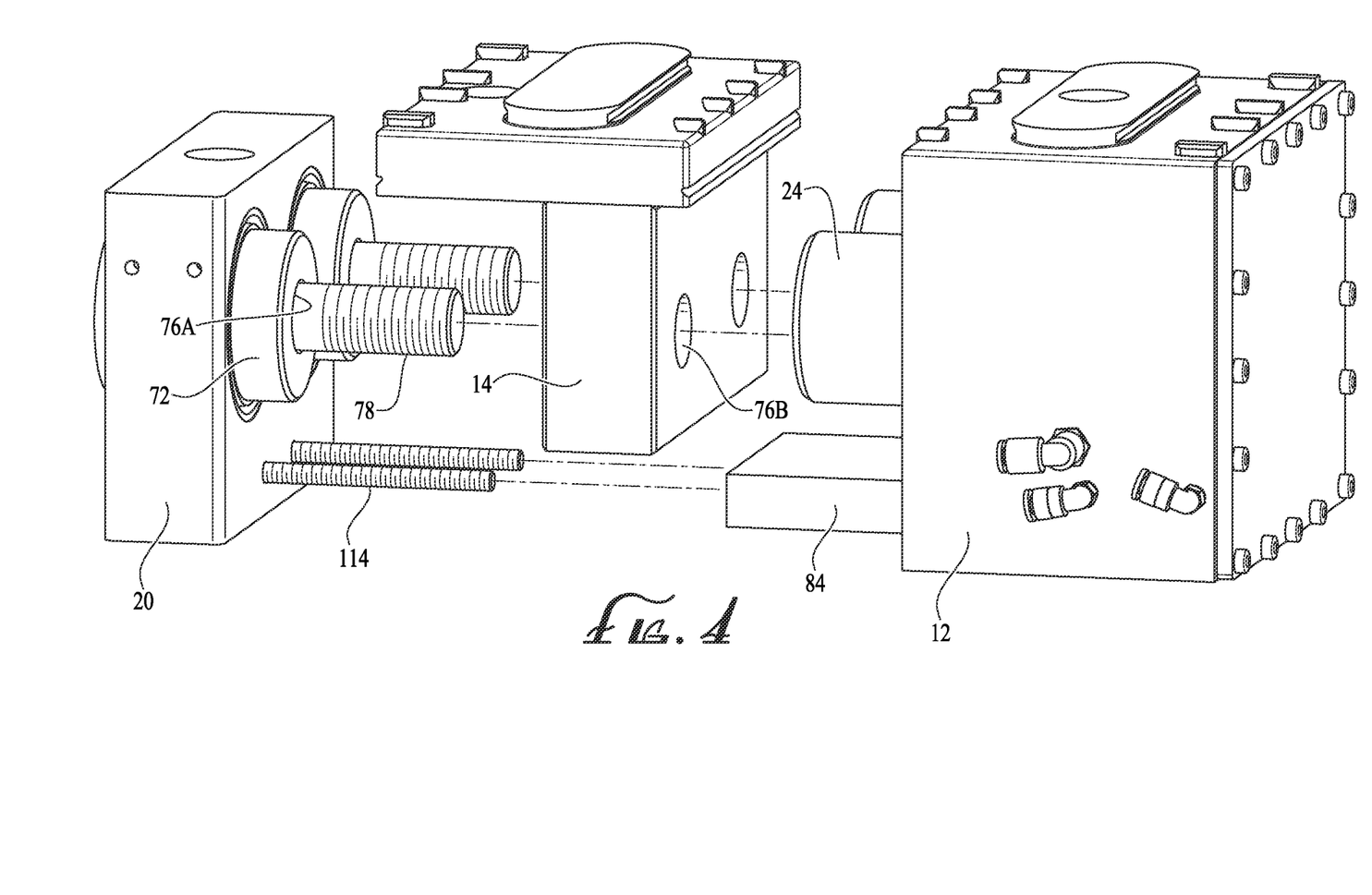
FIG. 4 is a partly exploded trimetric view of the vise.

Between shaft bores 22 and square piston pocket 30 are coupling apertures 42. Coupling apertures 42 include an o-ring groove 44. Coupling apertures 42 are configured to receive piston rod coupling shafts 18 and provide an airtight seal between shaft bores 22 and square piston pocket 30 when piston rod coupling shafts 18 are installed in coupling apertures 42 with coupling shaft o-rings 46 installed in o-ring groove 44.

Square piston 16 includes an o-ring groove 48 around the perimeter of square piston 16 and is configured to accept an o-ring 50 such that when square piston 16 is installed in square piston pocket 30, an airtight seal is created between a sidewall of pocket 30 and the perimeter of square piston 16. Square piston 16 includes piston apertures 52 that include an o-ring groove 54, a shoulder 56, and a countersink 58. When piston rod coupling shafts 18 are installed into piston coupling apertures 52 with o-rings 60 installed in o-ring grooves 54, an airtight seal is created that prevents air from passing through piston coupling apertures 52 to the other side of square piston 16. Shoulder 56 provides a surface for piston rod coupling shafts 18 to stop against. Flat head screws 62 pass through the opening formed in countersink 58 and fasten into threaded holes 64 in piston rod coupling shafts 18 rigidly attaching square piston 16 to piston rod coupling shafts 18. Piston rod coupling shafts 18 include a threaded stud 66 configured to fasten into mating holes 68 of guide shafts 24.

Moveable jaw assembly 14 includes guide shafts 24, a coupling plate 70, support shafts 72, and a moveable jaw 74. Support shafts 72 include a clearance hole 76A, and coupling plate 70 includes clearance holes 76B that allow large bolts 78 to pass through support shafts 72 and thread into guide shaft threaded holes 80. To prevent coupling plate 70 from moving relative to guide shafts 24 and support shafts 72 under heavy load, a large torque is applied to large bolts 78 to provide sufficient friction to prevent movement. In a preferred embodiment, large bolt 78 is a ¾ inch thread bolt with 10 threads per inch that is used and torqued to 450 foot/pounds upon final installation to provide the necessary friction to prevent coupling plate 70 from moving with respect to guide shafts 24.

Support shafts 72 pass through precision support shaft bores 82A of support shaft housing 20. Counterbores 82B on each end of support shaft bores 82A are configured to receive shaft wiper seals 28. A housing spacer 84 provides proper spacing between fixed housing 12 and support shaft housing 20 so that coupling plate 70 does not contact support shaft housing 20 when moveable jaw assembly 14 moves towards support shaft housing 20.

Coupling plate 70 includes dowel holes 86 and clearance holes 88 configured to precisely and rigidly attach moveable jaw 74 having corresponding dowel holes 90 and threaded holes 92. Dowel pins 94 fit tightly into dowel holes 86 and dowel holes 90 and precisely align moveable jaw 74 with coupling plate 70. Screws 96 pass through clearance holes 88 and thread into threaded holes 92 to rigidly attach moveable jaw 74 to coupling plate 70. In some embodiments, the top of fixed housing 12 and the top of moveable jaw 74 include a soft jaw interface 98 of the type described in U.S. Pat. No. 9,656,395 of Youngwerth et al. Alternatively, soft jaw interface 98 includes a mating interface between a soft jaw and a vise.

Figure 5:
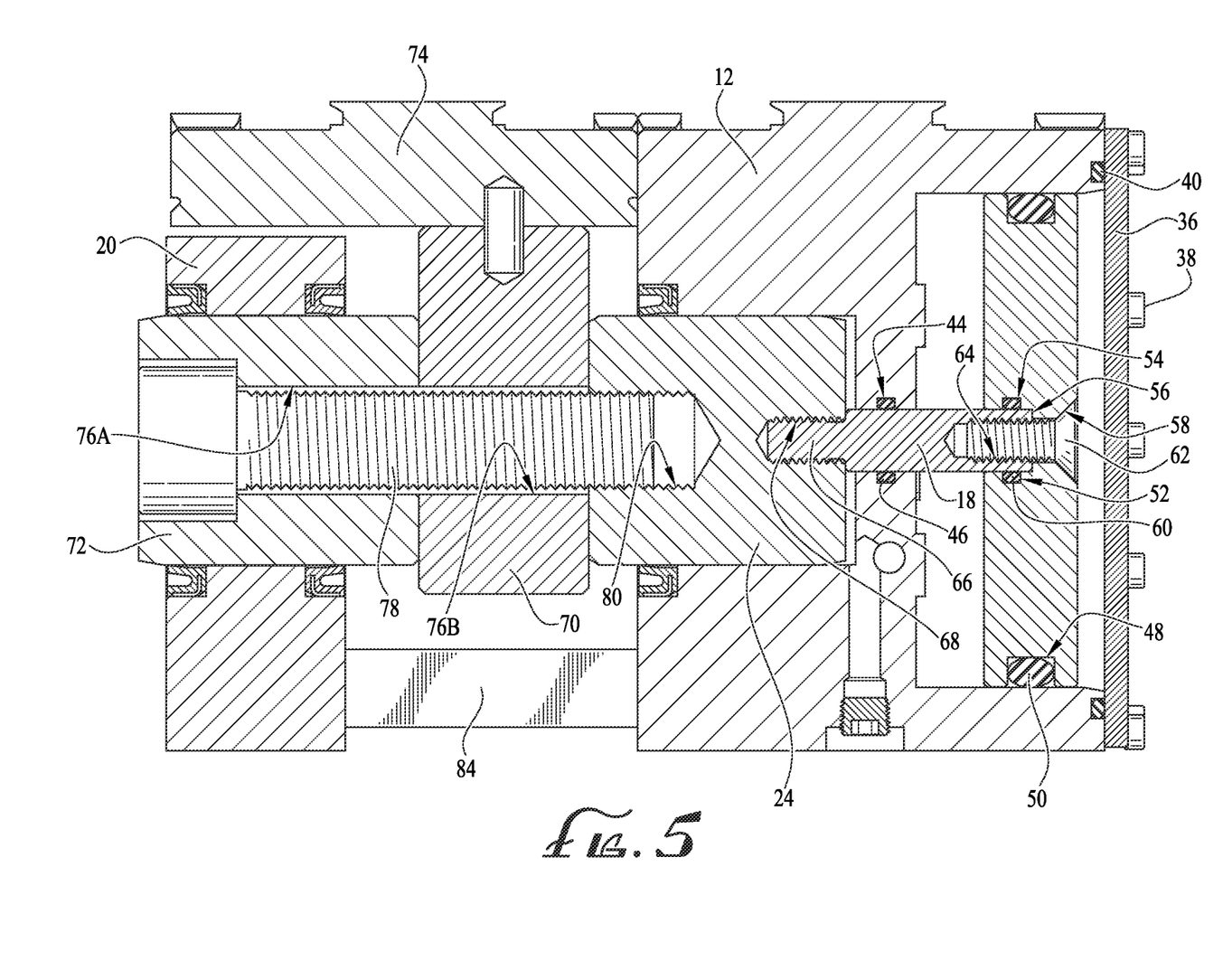
FIGS. 5 and 6 are section views taken along line 5-5 of FIG. 1, showing the vise, respectively, in closed and open positions.
Figure 6:
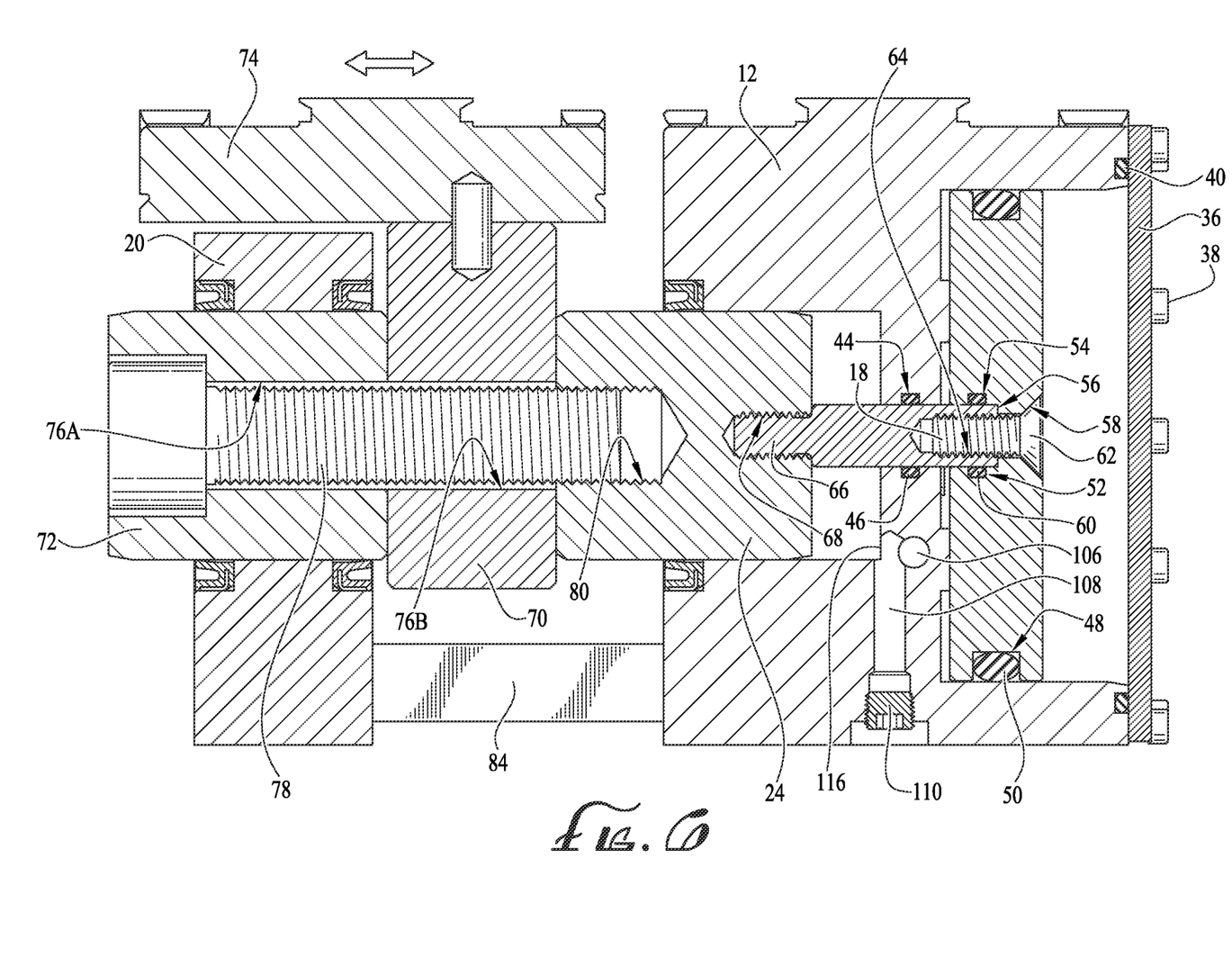

Fixed housing 12 includes an opening port 100A and a closing port 100B to allow pressurized air or fluid to provide a force to move square piston 16 in an opening or a closing direction. When pressure is supplied through opening port 100A, square piston 16 moves towards the bottom of square piston pocket 30. Piston rod coupling shafts 18 are urged by square piston 16, pushing guide shafts 24 and consequently moving moveable jaw assembly 14 away from fixed housing 12. When pressure is supplied to closing port 100B, square piston 16 moves away from the bottom of square piston pocket 30. Piston rod coupling shafts 18 are urged by square piston 16, pulling guide shafts 24 and consequently moving moveable jaw assembly 14 towards fixed housing 12.

Counterbored mounting holes 102 are provided in fixed housing 12 and support shaft housing 20 to accept mounting bolts (not shown) to secure vise 10 to a table. A pass through hole 104 is provided in moveable jaw 74 to allow a mounting bolt (not shown) to pass through and secure vise 10 to a table.

A breather port 106 is provided in fixed housing 12 to prevent pressure and vacuum from building in shaft bores 22. Breather port 106 is coupled to shaft bores 22, through a vertical hole 108 that intersects shaft bore 22 and breather port 106. A plug 110 seals vertical hole 108. Vertical holes 108 are provided to allow breather port 106 to be offset so it can pass by counterbored mounting holes 102 in fixed housing 12.

Moveable jaw assembly 14 is constrained in the opening direction when square piston 16 makes contact with stopping pads 112 at the bottom of square piston pocket 30. In one embodiment, moveable jaw assembly 14 is constrained in the closing direction when moveable jaw 74 makes contact with fixed housing 12.

Final assembly and tightening of the vise 10 may be performed on a CNC table or a fixture plate. Performing final assembly and tightening of fasteners in the proper sequence allows all components of vise 10 to properly align to prevent the shafts from binding in the bores. Prior to final assembly, fixed housing 12 is assembled with guide shafts 24, piston rod coupling shafts 18, square piston 16, and cover plate 36 fitted with fasteners, shaft wipers, and o-rings.

Support shafts 72 are inserted into support shaft housing 20, coupling plate 70 is attached to moveable jaw 74, and moveable jaw 74 and bolts 78 pass through clearance holes 76A and clearance holes 76B and thread into guide shaft threaded hole 80 such that a small amount of torque is applied to bolt 78. In some embodiments, the torque is approximately 10 inch pounds. Bolts 114 pass through support shaft housing 20 and through housing spacer 84 and are threaded into fixed housing 12 such that a small amount of torque is applied to bolt 114. In some embodiments, the torque is approximately 10 inch pounds.

In this state, vise 10 can be placed on a fixture plate or a CNC table, either of which may be very flat and rigid. Mounting bolts (not shown) are passed through counterbored mounting holes 102 in vise 10. The mounting bolt passing through counterbored mounting hole 102 in the fixed housing is properly torqued and the mounting bolt passing through support shaft housing 20 is fastened such that a small amount of torque is applied to the bolt. In some embodiments, the torque is approximately 10 inch pounds.

With a light closing force applied to square piston 16, moveable jaw 74 can be aligned with fixed housing 12. Once moveable jaw 74 is aligned with fixed housing 12, bolts 78 can be torqued so as to prevent coupling plate 70 from moving with respect to guide shafts 24. Bolts 114 are then torqued, frictionally coupling support shaft housing 20 to fixed housing 12 in proper alignment.

FIG. 6 also shows an optional hole 116 that intersects with guide shaft bore 22 (FIG. 3), and hole 116 is in fluid communication with vents on the outside of vise 10. In some embodiments, hole 116 facilitates venting of shaft bores 22, otherwise when vise 10 opens, negative pressure is created in the chamber and coolant will pass through the rod wipers into shaft bores 22.

To actuate a clamp force (i.e., closing automatic vise 10) in response to a pressure change, increased pressure is applied in a pressure zone 120 (FIG. 5). Clamp force is a function of the following equation:

$$F_c = P(A_n - A_r)$$

where $F_c$ is the clamp force, P is the pressure (e.g., fluid or pneumatic), $A_n$ is a nominal piston face area (see, e.g., surface area 124, FIG. 3), and $A_r$ is a rod-connection cross-section area (e.g., an area 130 in which a piston rod coupling shaft 18 fills piston apertures 52).

A total of surface area 124 minus a total of area 130 is also referred to as a realizable piston face area on which the pressure acts to move piston 16 in pocket 30. Because each piston rod coupling shaft 18 has a rod-connection cross-section area that is less than a cross-section area of its corresponding guide shaft 24, piston rod coupling shaft 18 is configured to provide a mechanical coupling between piston 16 and guide shaft 24 that helps minimize the reduction in nominal piston face area. In other words, nominal piston face area is reduced only by an amount corresponding to the rod-connection cross-section area (instead of that of guide shaft 24), thereby forming the realizable piston area that is greater than that which would be available with a direct interface between guide shaft 24 and piston 16.

Clamp force is used in the above example to refer to a closing force, which is reduced as a function of $A_r$. Skilled persons will appreciate, however, that the term clamp force is a generic term that, in some other embodiments, may refer to an opening force, e.g., when clamping an inside diameter of a part. Accordingly, the term clamp force is used to refer to any closing or opening force that is subject to a reduction because shafts are connected to a nominal piston face area. Conversely, the term restorative force is any closing or opening force that is not subject to such a reduction because no shafts are connected to a nominal piston face area.

FIGS. 7-11 show another embodiment of an automatic vise 210 including a fixed housing 212, a moveable dovetail 214, a square piston 216, a piston rod coupling shaft 218, and a guide shaft 220. Fixed housing 212 includes a shaft bore 222 to receive guide shaft 220. Shaft bore 222 includes counterbores 224 configured to receive shaft wiper seals 226. Fixed housing 212 includes a square piston pocket 230 opposite shaft bore 222 and configured to receive square piston 216. At the perimeter of square piston pocket 230 is an o-ring groove 232 and threaded holes 234 configured to receive a cover plate 236 such that when cover plate 236 is attached to fixed housing 212 using screws 238 and an o-ring 240, an airtight seal is created between cover plate 236 and the square piston pocket 230. A toe-clamp groove 242 is provided around the perimeter of fixed housing 212 and optionally a toe-clamp plate 246 can be mounted between cover plate 236 and screws 238. Toe-clamp groove 242 and toe-clamp plate 246 can be used to provide a surface for a toe clamp (not shown) to secure vise 210 to a table.

Figure 8:
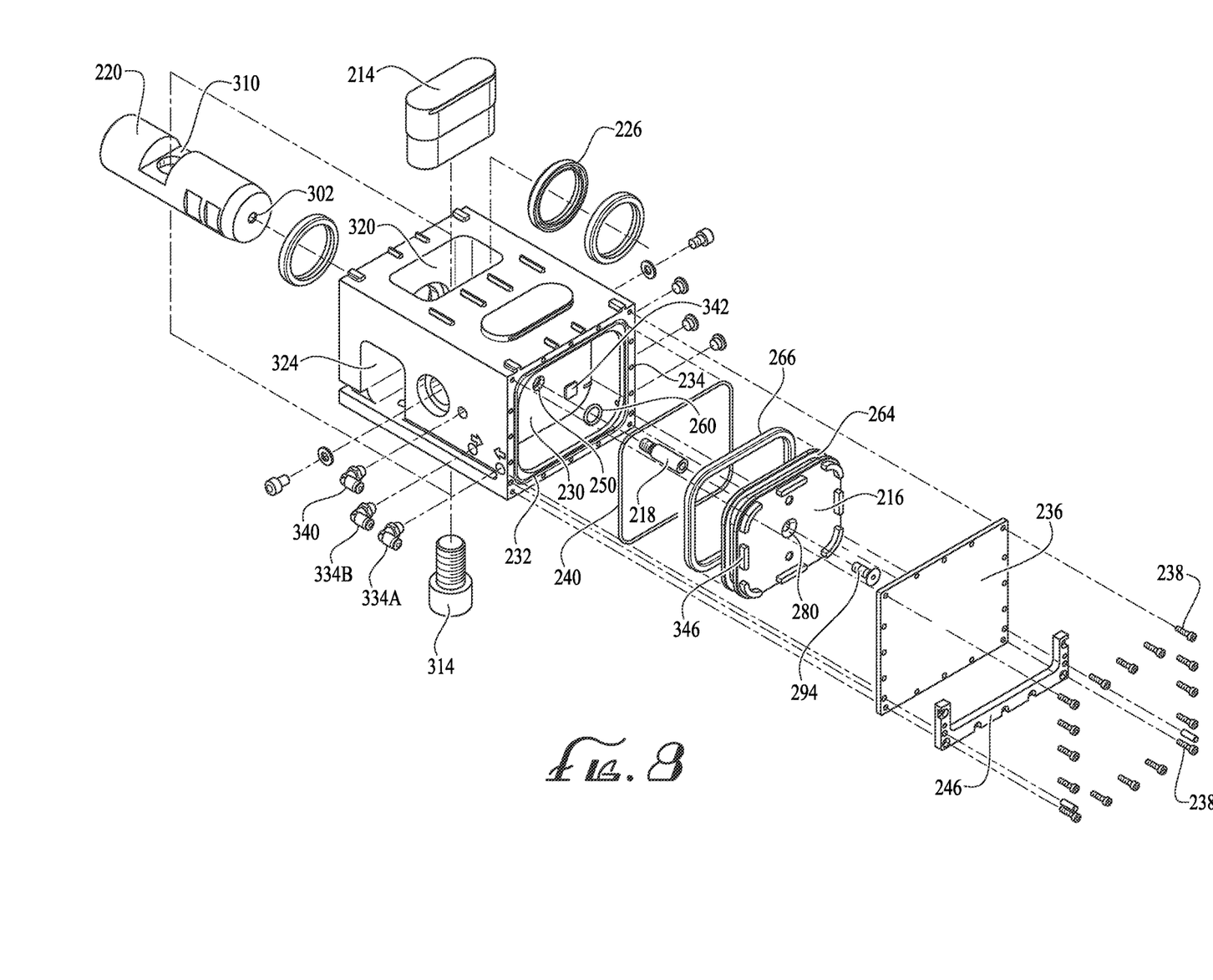
FIGS. 8 and 9 are exploded isometric views of the vise.
Figure 9:
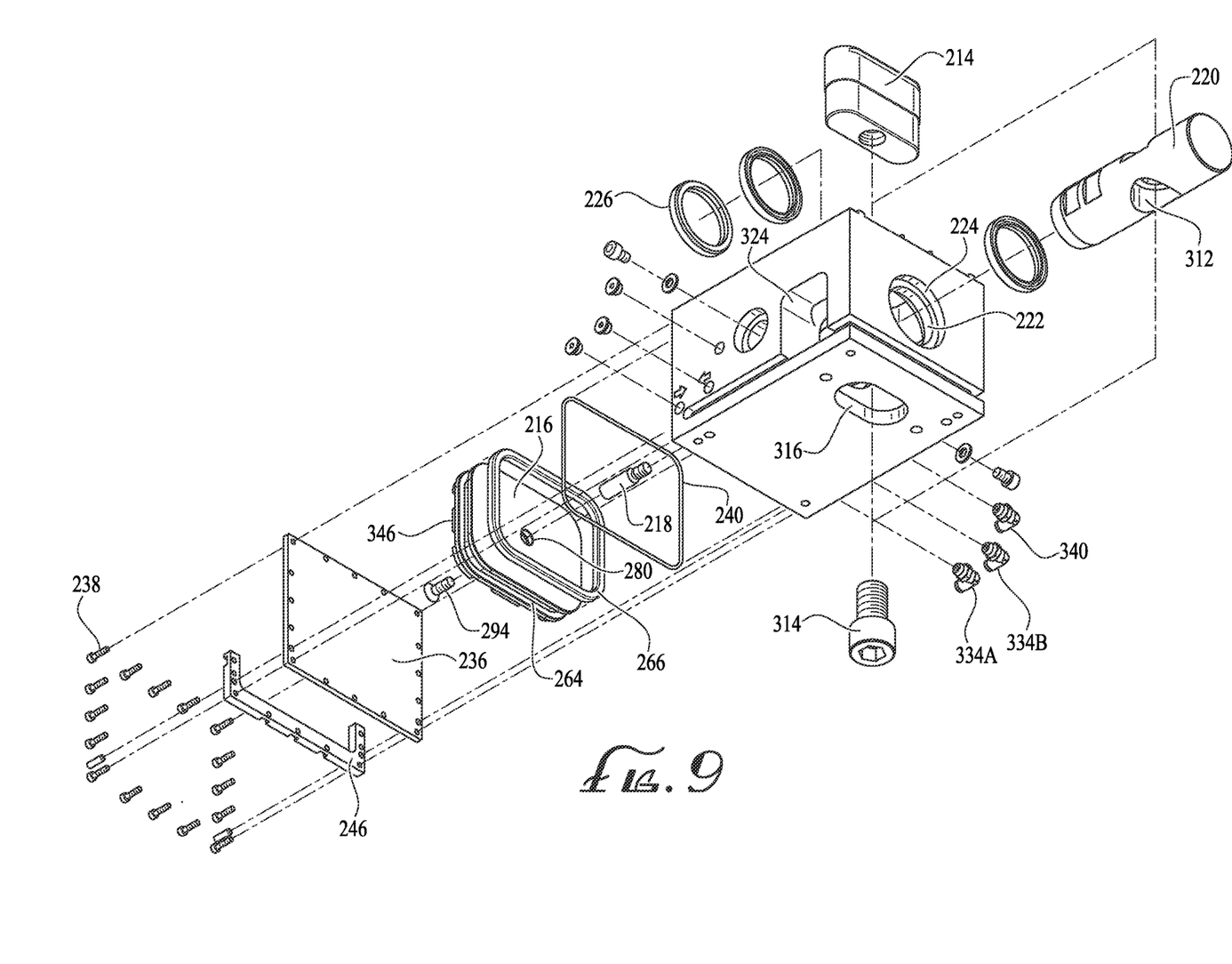

Between shaft bore 222 and square piston pocket 230 is a coupling aperture 250. Coupling aperture 250 includes an o-ring groove 252. Coupling aperture 250 is configured to receive piston rod coupling shaft 218 and provide an airtight seal between shaft bore 222 and square piston pocket 230 when piston rod coupling shaft 218 is installed in coupling aperture 250 with coupling shaft o-ring 260 installed in o-ring groove 252.

Square piston 216 includes an o-ring groove 264 around the perimeter of square piston 216 and is configured to accept an o-ring 266 such that when square piston 216 is installed in square piston pocket 230, an airtight seal is created between a sidewall of pocket 230 and the perimeter of square piston 216. Square piston 216 includes a piston coupling aperture 280 that includes an o-ring groove 282, a shoulder 284, and a countersink 286. When piston rod coupling shaft 218 is installed into piston coupling aperture 280 with an o-ring 290 installed in o-ring grooves 282, an airtight seal is created that prevents air from passing through piston coupling aperture 280 to the other side of square piston 216. Shoulder 284 provides a surface for piston rod coupling shaft 218 to stop against. A flat head screw 294 passes through the opening formed in countersink 286 and fastens into a threaded hole 296 in piston rod coupling shaft 218 rigidly attaching square piston 216 to piston rod coupling shaft 218. Piston rod coupling shaft 218 includes a threaded stud 300 configured to fasten into a mating hole 302 of guide shaft 220.

Guide shaft 220 includes a pocket 310 configured to accept moveable dovetail 214. Guide shaft 220 includes a counterbored hole 312 configured to receive a bolt 314 and thread into moveable dovetail 214 to secure moveable dovetail 214 to guide shaft 220. Fixed housing 212 includes an access hole 316 that allows bolt 314 to pass through fixed housing 212 for assembly. Fixed housing 212 includes a moveable dovetail hole 320 that is configured to accept moveable dovetail 214 with enough room for moveable dovetail 214 to move from an open position to a closed position. Side openings 324 are provided to allow chips and other debris from the manufacturing process to pass through dovetail hole 320 and out from side openings 324.

Figure 10:
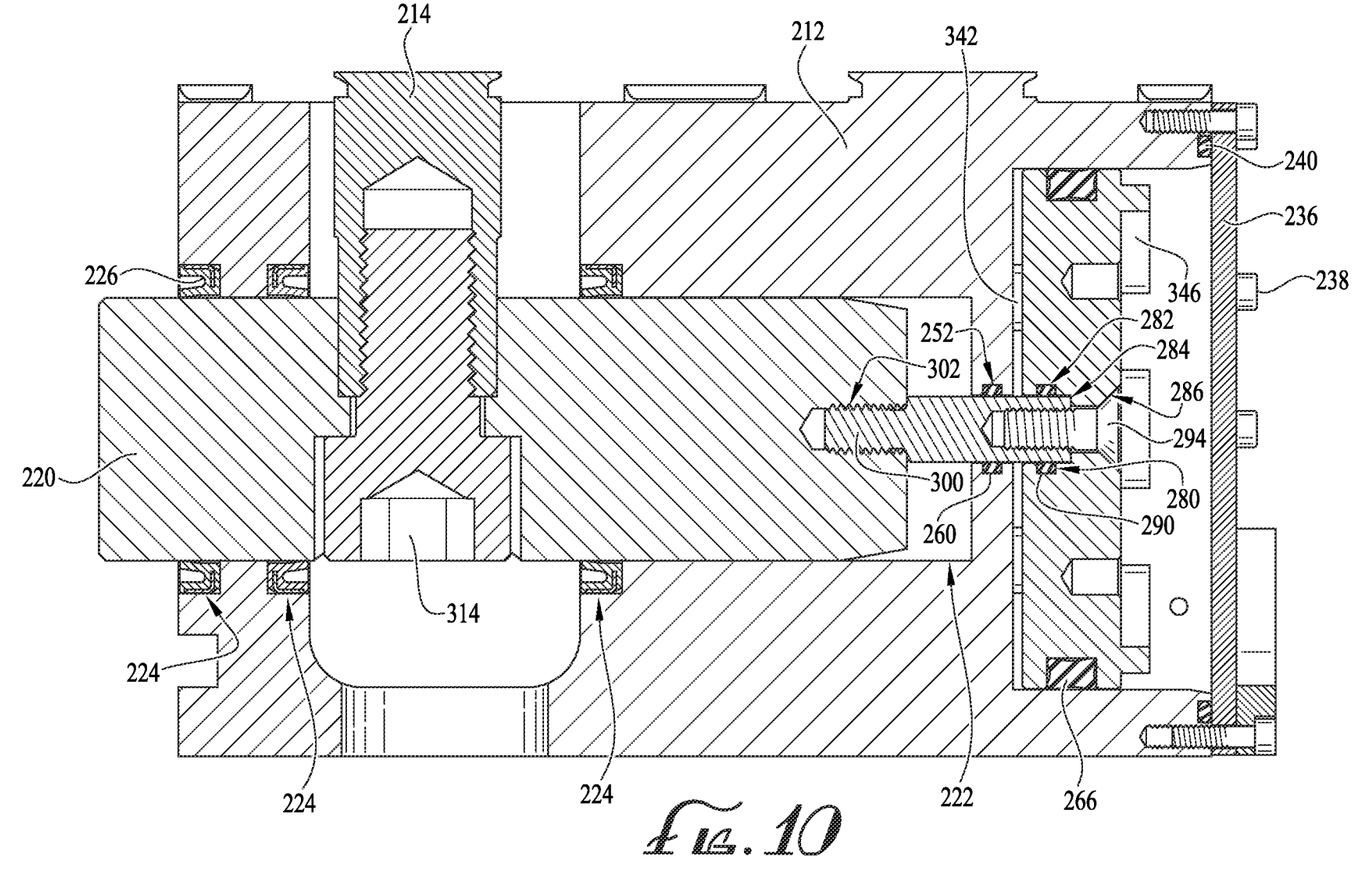
FIGS. 10 and 11 are section views taken along line 10-10 of FIG. 7, showing the vise, respectively, in the opened and closed positions.
Figure 11:
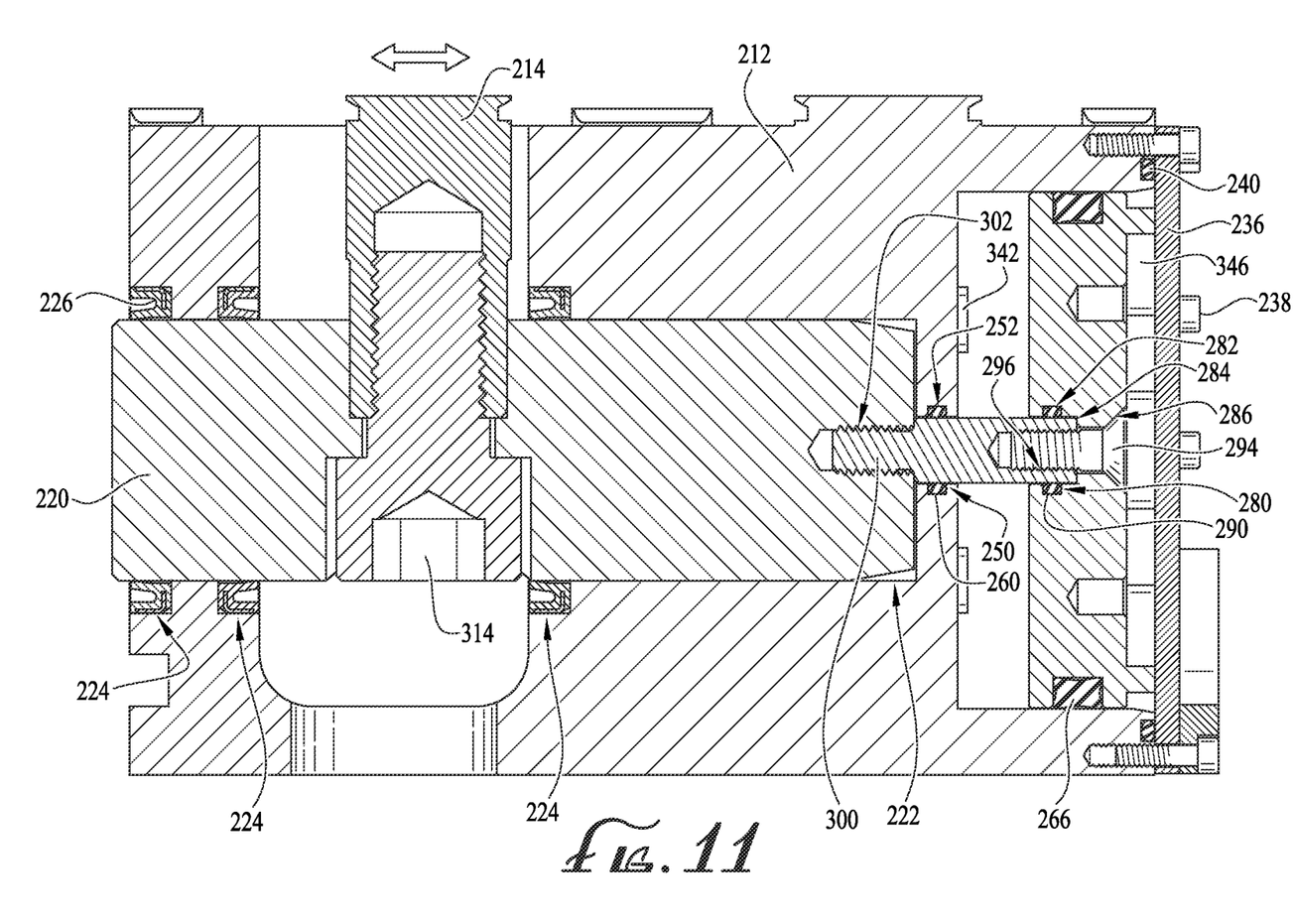

Guide shaft 220 is mounted in shaft bore 222 of fixed housing 212. Counterbores 224 are located in each opening of shaft bore 222 and are configured to receive shaft wiper seals 226.

Figure 7:
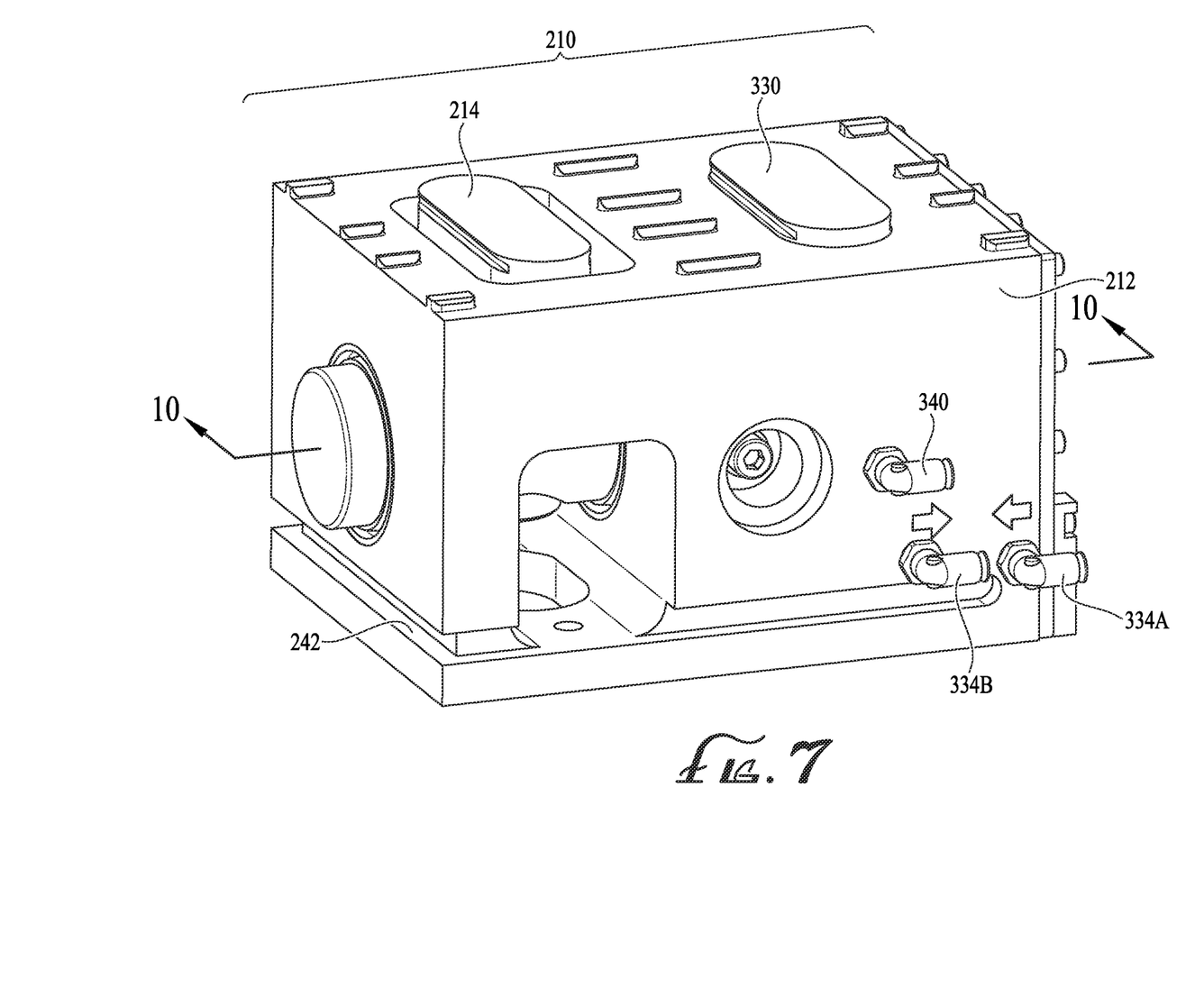
FIG. 7 is an isometric view of a vise, according to another embodiment.

In some embodiments, the top of fixed housing 212 and moveable dovetail 214 combine to form a soft jaw interface 330 compatible with soft jaws disclosed in the '395 patent of Youngwerth et al. Alternatively, soft jaw interface 330 includes a mating interface between a soft jaw and a vise.

Fixed housing 212 includes an opening port 334A and a closing port 334B to allow pressurized air or fluid to provide a force to move square piston 216 in an opening or a closing direction. When pressure is supplied through opening port 334A, square piston 216 moves towards the bottom of square piston pocket 230. Piston rod coupling shaft 218 is urged by square piston 216, pushing guide shaft 220 and consequently moving moveable dovetail 214 in an opening direction. When pressure is supplied to closing port 334B, square piston 216 moves away from the bottom of square piston pocket 230. Piston rod coupling shaft 218 is urged by square piston 216, pulling guide shaft 220 and consequently moving moveable dovetail 214 in a closing direction. A breather port 340 is provided in fixed housing 212 to prevent pressure and vacuum from building in shaft bore 222.

In some embodiments, moveable dovetail 214 is constrained in the opening direction when square piston 216 makes contact with stopping pads 342 at the bottom of square piston pocket 230. In some embodiments, moveable dovetail 214 is constrained in the closing direction when closing bosses 346 make contact with cover plate 236. Closing bosses 346 are ideally arranged around the perimeter of square piston 216 to reduce bending forces on cover plate 236.

As described previously, piston rod coupling shaft 218 has a cross-sectional area that reduces a nominal piston face area. But because vise 210 has one piston rod coupling shaft 218, it decreases the reduction of nominal piston face area, increasing the realizable piston face area, and thereby further enhances the clamp force.

Skilled persons will appreciate that many changes may be made to the details of the above-described embodiments without departing from the underlying principles of the disclosure. The scope of an invention should, therefore, be determined by claims and equivalents.

The invention claimed is:

1. A vise configured to apply a clamp force in response to a pressure change, the vise comprising:
 a housing including a pocket providing a pressure zone, a shaft bore, and a coupling aperture located between the shaft bore and the pocket;
 a piston defining a nominal piston face area in the pressure zone, the piston configured to slide in the pocket in response to the pressure change that actuates the clamp force as a function of a realizable piston face area representing a reduction from the nominal piston face area;
 a guide shaft configured to slide in the shaft bore in response to the pressure change, in which the guide shaft does not extend into the pressure zone; and
 a piston rod coupling shaft configured to slide in the coupling aperture and having a rod-connection cross-section area that is less than that of the guide shaft, the piston rod coupling shaft configured to mechanically couple the piston and the guide shaft such that axial movement of the piston is directly transmitted to the guide shaft in both extension and retraction, and whereby the nominal piston face area is reduced by an amount corresponding to the rod-connection cross-section area, thereby forming the realizable piston face area that is greater than that which would be available with a direct interface between the guide shaft and the piston.

2. The vise of claim 1, further comprising a moveable vise jaw coupled to the guide shaft.

3. The vise of claim 2, in which the moveable vise jaw includes a dovetail.

4. The vise of claim 2, further comprising a fixed vise jaw coupled to the housing.

5. The vise of claim 1, further comprising an airtight seal between the shaft bore and the pocket.

6. The vise of claim 1, further comprising an airtight seal between the piston and a sidewall of the pocket.

7. The vise of claim 1, further comprising an airtight cover sealing the pocket.

8. The vise of claim 1, further comprising a closing port and an opening port.

9. The vise of claim 8, in which the opening port is configured to provide a restorative force to open the vise.

* * * * *